United States Patent
Hietala et al.

[11] Patent Number: 5,150,075
[45] Date of Patent: Sep. 22, 1992

[54] POWER AMPLIFIER RAMP UP METHOD AND APPARATUS

[75] Inventors: Alexander W. Hietala, Cary; Gregory R. Black, Vernon Hills, both of Ill.

[73] Assignee: Motorola, Inc., Schaumburg, Ill.

[21] Appl. No.: 709,738

[22] Filed: Jun. 3, 1991

[51] Int. Cl.$^5$ .............................. H03G 3/30
[52] U.S. Cl. ...................... 330/279; 330/129; 455/126; 455/127
[58] Field of Search ............... 330/279, 129; 455/117, 455/126, 127, 116

[56] References Cited

U.S. PATENT DOCUMENTS

| | | | |
|---|---|---|---|
| 4,367,443 | 1/1983 | Hull et al. | 330/207 |
| 4,570,127 | 2/1986 | Tanimoto et al. | 330/279 |
| 4,592,073 | 5/1986 | Watanabe | 455/126 |
| 4,602,218 | 7/1986 | Vilmur et al. | 330/279 |
| 4,985,686 | 1/1991 | Davidson et al. | 330/295 |
| 4,992,753 | 2/1991 | Jenson et al. | 330/129 |
| 5,038,112 | 8/1991 | O'Neill | 330/298 |
| 5,043,672 | 8/1991 | Youn | 330/129 |

Primary Examiner—Eugene R. LaRoche
Assistant Examiner—Tan Dinh
Attorney, Agent, or Firm—Kirk W. Dailey; Robert H. Kelly

[57] ABSTRACT

The present disclosure includes a discussion of a power amplifier controller which powers up a power amplifier (203) without a substantial burst of frequency noise. The controller has a RF output power detector (211) which generates a signal (229) correllated to the power level of the power amplifier (203). This signal (229) is compared (215) to a reference signal (213) to determine if the power amplifier (203) is active. The signal (227) generated by this comparator (215) is used to determine the voltage level of the Automatic Output Control (AOC) signal (231).

12 Claims, 6 Drawing Sheets

POWER AMPLIFIER RAMP UP METHOD AND APPARATUS

FIELD OF THE INVENTION

Generally, this invention relates to power amplifier control circuits. More specifically, the invention relates to power ramp up control circuits for power amplifiers.

BACKGROUND OF THE INVENTION

The use of power amplifiers in transmitting radio frequencies (RF) signals has many applications, including but not limited to radiotelephone communications systems. In a radiotelephone communications system, there are multiple fixed site transceivers. Each fixed site transceiver is an interface between the line telephone system and multiple, portable, or mobile radiotelephone systems contained within a geographic area served by the fixed site transceiver. The fixed site transceiver and the radiotelephone communicate by sending and receiving FM modulated radio frequency signals to each other.

In an analog radiotelephone system, there is a large available RF spectrum available for radiotelephone communications. The available RF spectrum is channelized into relatively narrow segments of frequency. Upon request, each radiotelephone is allocated a frequency channel upon which to broadcast and receive information from the fixed site transceiver. This is known as a Frequency Division Multiple Access (FDMA) system. During a phone call, the radiotelephone transmitter would turn-on and remain on the fixed frequency for the entire time of the phone call. Thus, the transmitter and subsequently the power amplifier (PA) of the radiotelephone only needed to turn-on once and turn-off once for a given phone call which could last several minutes. The fixed site transceiver could also remain on for the duration of a phone call. In an FDMA system, since there are a limited number of turn-ons, the turn-on and turn-off requirements of the power amplifier are not very stringent. If a transmitter is turned on quickly, there is a momentary large burst of noise, however, since this would only occur once during a conversation, it would not substantively affect the communication system. Similarly, if the power amplifier is turned on slowly, there would be an imperceptible gap in the conversation at the beginning of a phone call. These problems are only inconveniences to the user and are not substantive system degrading problems.

In the newly proposed digital cellular radiotelephone systems, the power amplifier turn-on requirements have increased dramatically. The new systems use a time division multiple access (TDMA) communications system. In a TDMA communications system, 8 or 16 radiotelephones share a single 200 kilohertz wide channel on which to broadcast. Each radiotelephone in a channel is allocated one 577 microsecond (uS) time slot on a repetitive basis. During this time slot the radiotelephone ramps up the power amplifier to the proper frequency and power, sends the desired data, and ramps down the power amplifier so as not to disturb or interfere with the other users sharing the same frequency. Thus, the requirements for controlling the power amplifier are greatly increased.

The Group Special Mobile (GSM) recommendations ETSI/PT-12 05.05 (4.2.2 and 4.5.2), March, 1991 were developed to define a digital radiotelephone communications system. These recommendations were aware of the increased power amplifier requirements and have defined a time mask and a spectral frequency mask, as illustrated in FIGS. 7 and 8, which all radiotelephone equipment used in the system must meet. The specifications concerning the time and frequency masks demand the development of a very smooth ramp up of the PA and stringent time constraints.

Without these requirements, TDMA digital communications systems would not operate. If the PA is turned on too slow, even a few microseconds, severe damage to the data transmitted between the fixed site transceiver and the radiotelephone would occur. Turning a power amplifier on very quickly results in large spectrum burst causing interference with radiotelephones of the same or similar frequencies. Therefore, a power amplifier controller is needed which ramps the power amplifier up to the required power quickly and smoothly without causing a frequency noise burst or missing data.

Previously, a digital signal processor (DSP) has been used along with a digital-to-analog converter (D/A) to generate a ramp up of the PA as required by the GSM specifications. The Automatic Output Control (AOC) voltage generated by the DSP is fed into an integrator where it is compared to the output of an RF power detector. The difference between the AOC signal and the detector signal is fed into the control input of the power amplifier system. Under ideal conditions, this closed loop power amplifier system will adjust the control voltage until the RF control detector is equal to the AOC voltage. However, the system is far from ideal.

Two characteristics of the system lead to shortfalls in maintaining the time and spectral frequency masks. First, the detector has a finite range over which it detects RF from the output of the amplifier. Below this range, the detector outputs a small voltage, which does not correlate to the power changes of the amplifier. Under this condition, the control loop is open and the output power is in no way correlated to the AOC voltage. In fact, the integrator will force its output to the maximum negative voltage, because the detector voltage will be greater than the AOC voltage. Secondly, the exciter/power amplifier typically has a turn-on threshold which the integrator must meet before the ramp up waveform can be input to the amplifier.

Because of the shortfalls of the control loop, when the power amplifier becomes active, and the detector subsequently becomes active, the control loop closes and attempts to track the AOC voltage. At this point, the control loop will attempt to track the AOC voltage at its current level. This will result in a spectral frequency mask violation because of the sharp turn-on of the power amplifier 401 as shown in FIG. 4.

Therefore, a need exists for a power amplifier control loop which is adaptive to the requirements of each individual power amplifier and allows for a quick and smooth power ramp up.

SUMMARY OF THE INVENTION

The present invention encompasses a transmitter including means for amplifying a first signal and means for controlling the means for amplifying. The means for amplifying having at least two inputs, at least one output, an active state and an inactive state and responsive to a voltage of a second signal. The first signal having a power level, a first frequency and coupled to a first one of the at least two inputs of the means for amplifying.

The means for controlling comprises: 1) means for generating the second signal coupled to a second one of the at least two inputs of the means for amplifying; 2) means for generating a third signal which is responsive to the active state of the means for amplifying; 3) means for determining the voltage level of the second signal, dependent on the state of the third signal, whereby, the means for amplifying the first signal is ramped up into the active state without a substantial burst of frequency noise.

DESCRIPTION OF A PREFERRED EMBODIMENT

Figure 1:
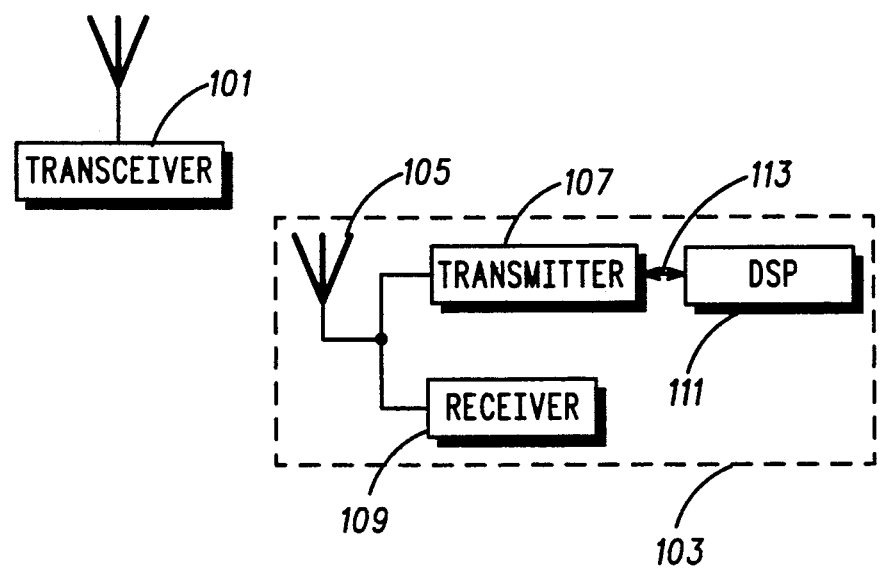
FIG. 1 is a block diagram of a radiotelephone communications system in accordance with the present invention.
Figure 3:
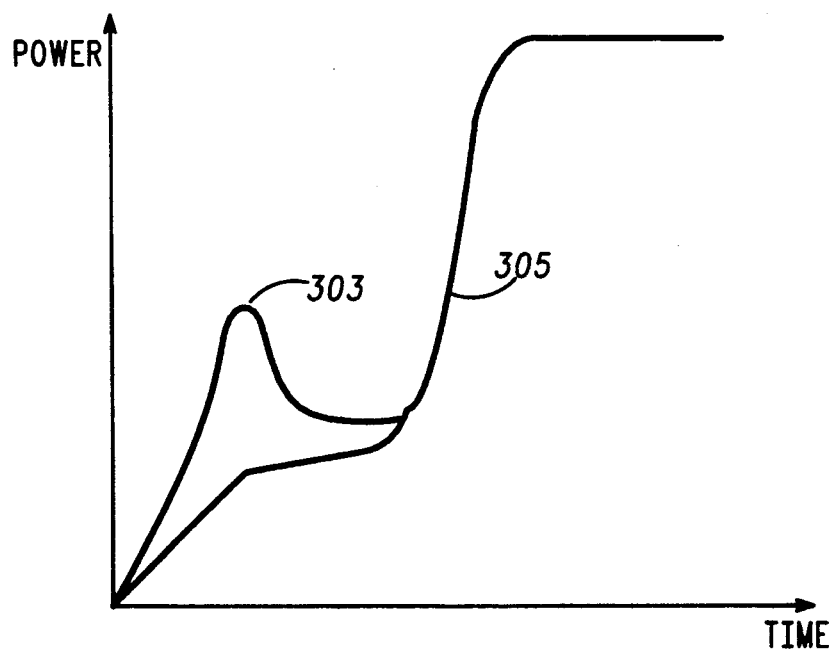
FIG. 3 is a power versus time graph from the output of a power amplifier described in the Background of the Invention.

The invention disclosed herein, may be employed in a TDMA radiotelephone system which is illustrated in FIG. 1. In a radiotelephone system there is a fixed site transceiver 101, which sends out RF signals to portable and mobile radiotelephones contained within a geographic coverage area. One such phone is the portable radiotelephone 103. A radiotelephone system is assigned a frequency band which it is allowed to broadcast within. The frequency band is broken up into several channels 200 Kilohertz wide. Each channel is capable of handling communications between the transceiver 101 and up to 8 radiotelephones within its coverage area. Each radiotelephone is assigned time slots in which to broadcast and receive information from the transceiver 101. Each time slot is approximately 577 microseconds in duration. Portable radiotelephone 103, model number F19UVD0960AA available from Motorola, Inc., includes a transmitter 107, a receiver 109, and a digital signal processor (DSP) 111, such as the DSP 56000 available from Motorola, Inc. Several signals are transmitted between the DSP 111 and the transmitter 107 on multiple signal lines 113.

Figures 7, 8:
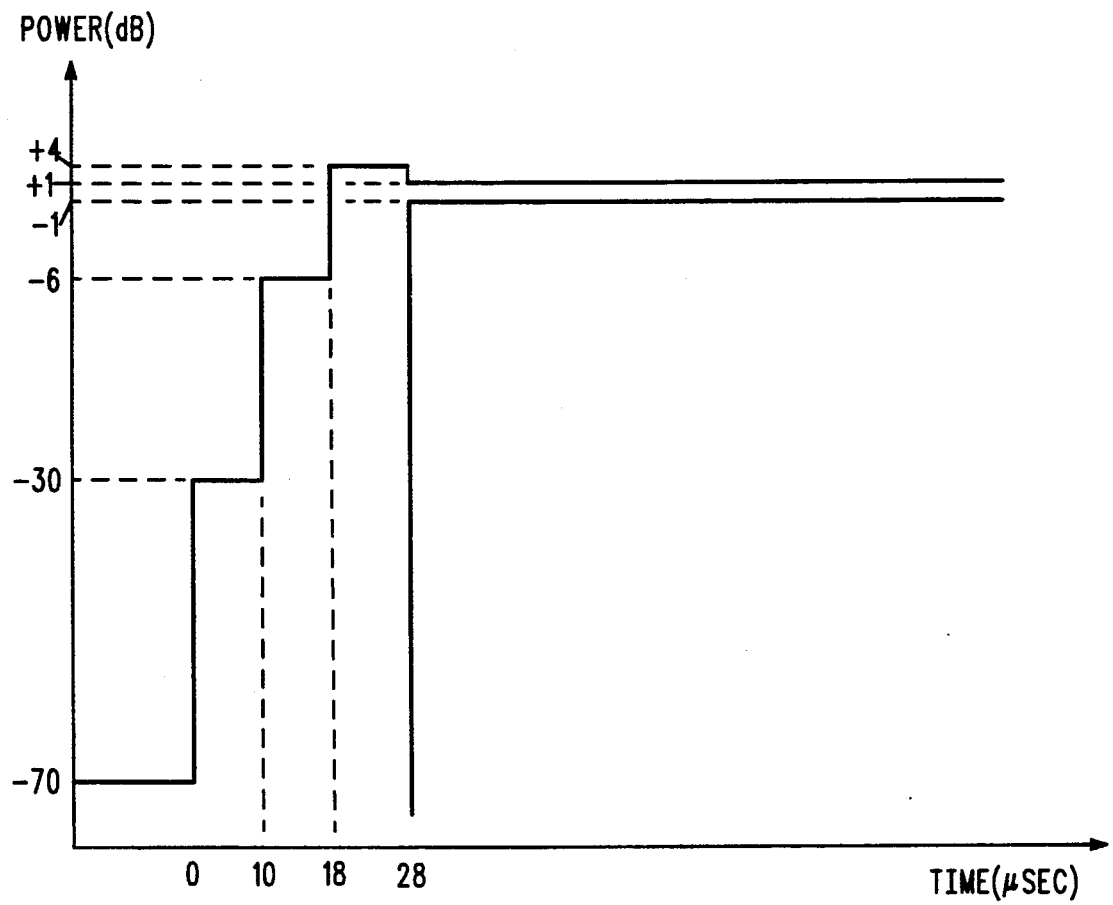
FIG. 7 is the GSM time mask as defined by GSM recommendation 05.05 (4.2.2).
FIG. 8 is the GSM spectral frequency mask as defined by GSM recommendation 05.05 (4.5.2).

The transmitter 107 and the transceiver 101 both contain power amplifiers with stringent requirements as defined by the Group Special Mobile (GSM) recommendations ETSI/PT-12 05.05 (4.2.2 and 4.5.2), March, 1991. The specifications require any transmitter to meet a time mask as shown in FIG. 7 and a spectral frequency mask as shown in FIG. 8. The antenna 105 is used to transmit and receive radio frequency signals to and from transceiver 101.

Upon receiving signals, an antenna 105 converts the signals into electrical radio frequency signals and transfers the signals to the receiver 109. The receiver 109 demodulates and converts electrical radio frequency signals into data signals usable by the rest of the portable radiotelephone 103.

Upon transmission of the radio frequency signals, the DSP 111 feeds the transmitter 107 information which is desired to be transmitted and also controlling information for the transmitter 107 via signal lines 113. The transmitter 107 takes the data and converts it into electrical radio frequency signals and gives the electrical radio frequency signals the appropriate amount of power necessary with use of the power amplifier. The antenna 105 then takes the electrical radio frequency signals and converts them into radio frequency signals and transmits them into the air for use by the transceiver 101.

Figure 2:
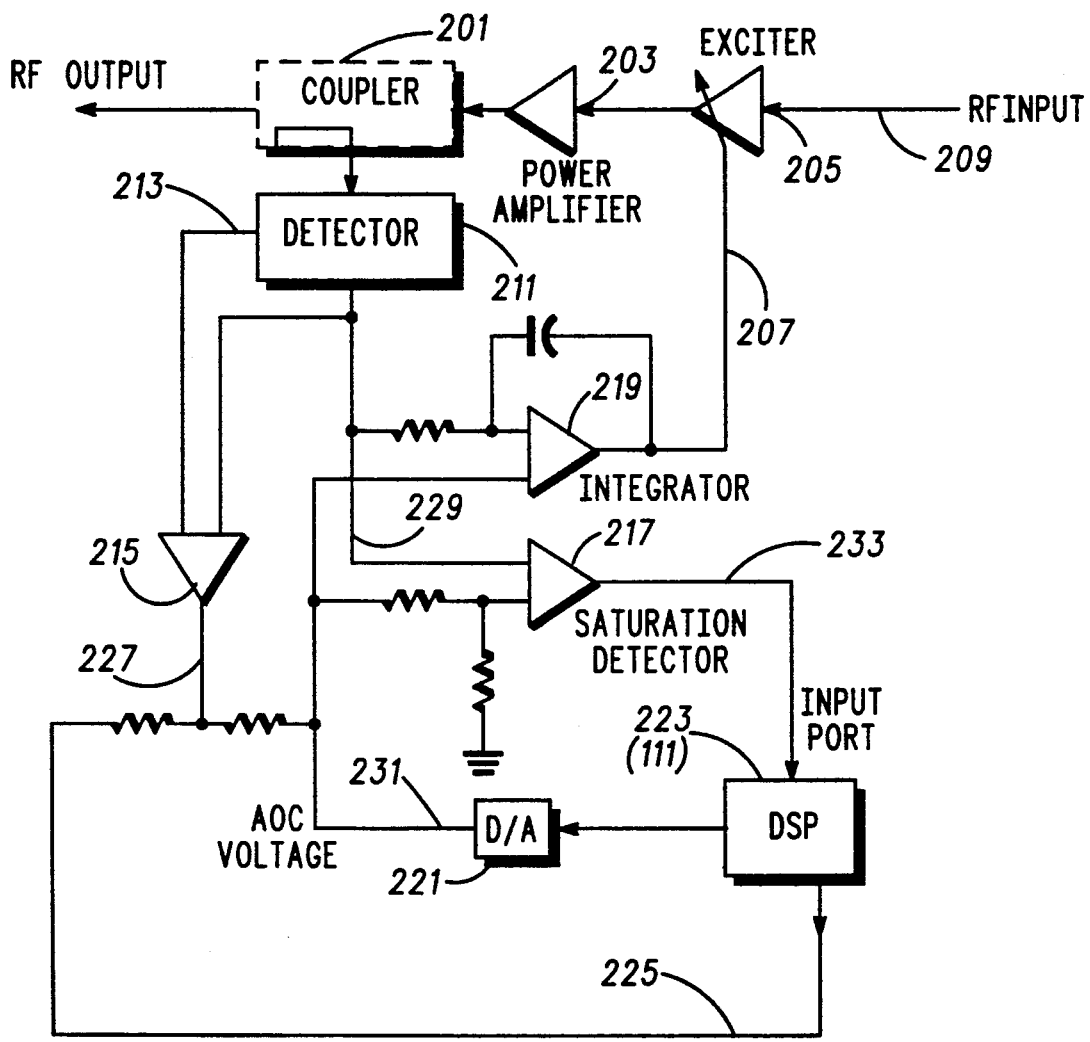
FIG. 2 is a block diagram of a power amplifier and corresponding power amplifier control circuit in accordance with the present invention.
Figure 4:
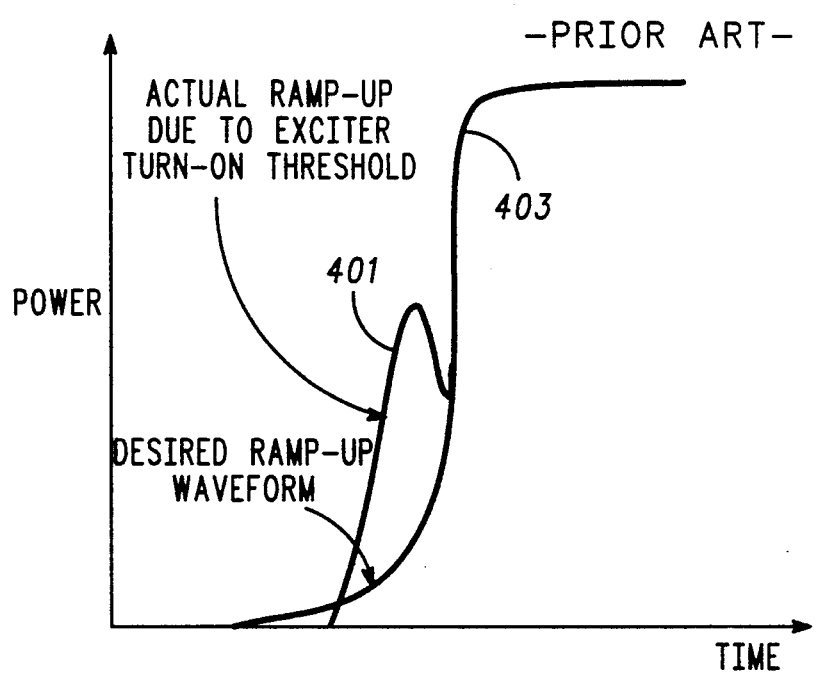
FIG. 4 is a power versus time graph which shows the desired output of a power amplifier and the waveform of a power amplifier which does not employ the present invention.

The power amplifier 203 and its associated controllers are located in the transmitter 107, and illustrated in the block diagram of FIG. 2. The function of the power amplifier 203 is to take in the radio frequency input which contains voice and data which is to be transmitted back to the fixed site transceiver 101 and amplify the RF input signals to the appropriate power level for transmission. The exciter 205 is an adjustable power amplifier which adjusts the RF input signals 209 to their proper input level for the power amplifier 203.

The block diagram of FIG. 2 contains several control loops, including the standard control loop, the ramp up loop, and the saturation detector loop of the power amplifiers. All of the control loops utilize the coupler 201. The coupler 201 is an electromagnetic coupler which couples the RF output signals into the control loops without causing excessive loss to the RF output signals.

The detector 211 detects the forward power level of the RF output signals and creates a power level signal 229 the voltage of which is responsive to the amount of forward power in the RF output signals. The detector 211 also outputs a reference signal 213. The voltage of the reference signal 213 is responsive to the DC offset output by the detector in absence of activity of the power amplifier 203.

The power amplifier control loop utilizes the comparator 215 and the DSP 223 in addition to the standard control loop. The comparator 215 outputs the signal 227. The output signal 227 indicates detection of activity of the power amplifier 203 and the exciter 205. The output signal 225 is generated by the DSP 223 and used to pull up the output signal 227. The output signal 225 is high at the beginning of a timeslot and is lowered after the desired output waveform 505 is output by the DSP 223. This causes the output signal 227 to be high during an active time slot and before the power amplifier 203 and the exciter 205 become active. Upon activation of the power amplifier 203 and the exciter 205, the output signal 227 becomes low.

10 uS into an active timeslot, the DSP 223 generates a desired waveform and sends it to the digital-to-analog converter 221. In this preferred embodiment, the preferred waveform 505 is a raised cosine which ramps the power amplifier 203 smoothly up to its desired power level. The D/A converter 221 converts the digital input to an analog output signal 231, known as the AOC signal. The AOC signal 231 is then put into the integrator 219, the output signal 207 of the integrator 219 is input as a control voltage to the exciter amplifier 205 to control the amplification level of the exciter 205.

Figure 5:
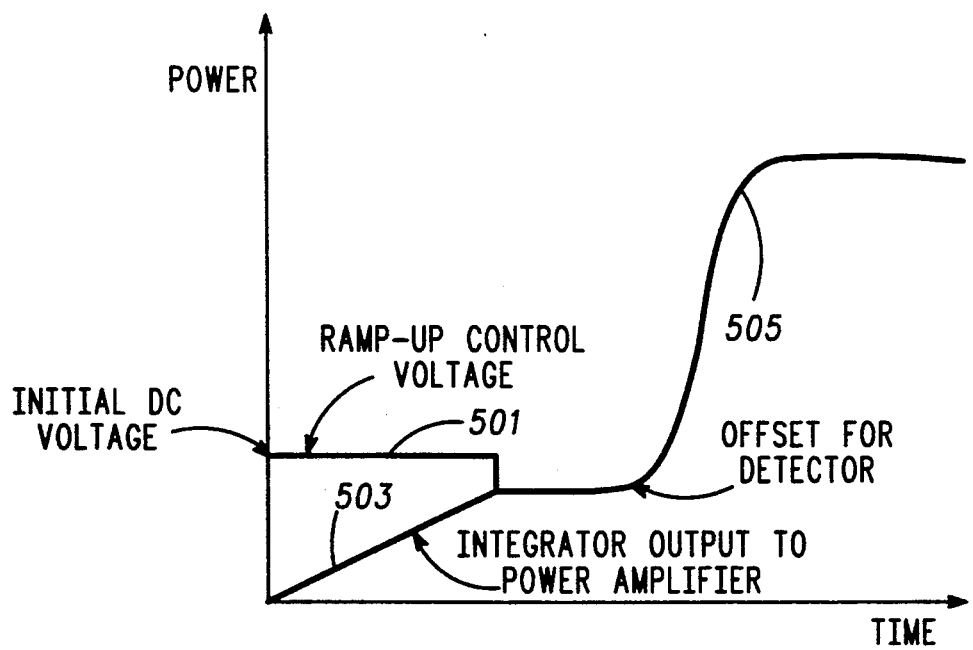
FIG. 5 is a power versus time graph of a power amplifier control loop described in the Background of the Invention.

An illustration of the voltage of the AOC signal 231 is shown in FIG. 5. Initially, the DSP 223 and thus the D/A 221 in conjunction with output signal 227 output a constant DC voltage 501 on the AOC signal 231, thus, the integrator puts out a constant slope signal shown in 503. This signal 503 is output until the comparator 215 detects activity of the power amplifier 203. Upon detection of activity of the power amplifier 203, the output signal 227 is reduced to ground, which effectively stops the linear ramp-up. The AOC signal 231 remains at a voltage sufficient to maintain activity of the power amplifier 203 until the DSP 223 puts out the desired waveform to ramp the exciter and power amplifier into their desired power level. In the preferred embodiment, the delay is 10 uS from the beginning of the timeslot and the desired waveform is a raised cosine wave 505 as shown in FIG. 5.

The saturation control loop prevents the exciter 205 and power amplifier 203 from exceeding beyonds their amplification limit because of the control signal input 207. The saturation loop consists of coupler 201, the detector 211, the comparator 217 and the digital signal processor 223. The saturation detection comparator 217 compares the detector output signal 229 to the voltage of the AOC signal 231 to determine if the detector output signal 229 is responsive to changes in the voltage of the AOC signal 231. This comparison will indicate saturation from the control voltage when the voltage of the detector output signal 229 drops below the voltage of the AOC signal 231, because the detector voltage will not change with a corresponding change in the voltage of the AOC signal 231 during saturation. The saturation comparator output signal 233 is input into the DSP 223 which contains an algorithm. The algorithm steps down the voltage of the AOC signal 231 until there is a change in the detector output voltage 229. Then, the voltage of the AOC signal 231 can be stepped up or down. In the preferred embodiment, the voltage of the AOC signal 231 is stepped down further to insure that the power amplifier 203 remains unsaturated, however, the voltage of the AOC signal 231 could be stepped up to become closer to the saturation threshold depending on the specific needs of a given implementation. The voltage of the AOC signal 231 is held at a level slightly below the saturation threshold until the end of the time slot. For further details concerning the saturation control loop refer to U.S. patent application Ser. No. 07/709,737, filed Jun. 3, 1991, "Power Amplifier Saturation Detection and Correction Method and Apparatus", filed on behalf of Black et al., on May 31, 1991 assigned to the assignee of the present invention.

Figure 6B:
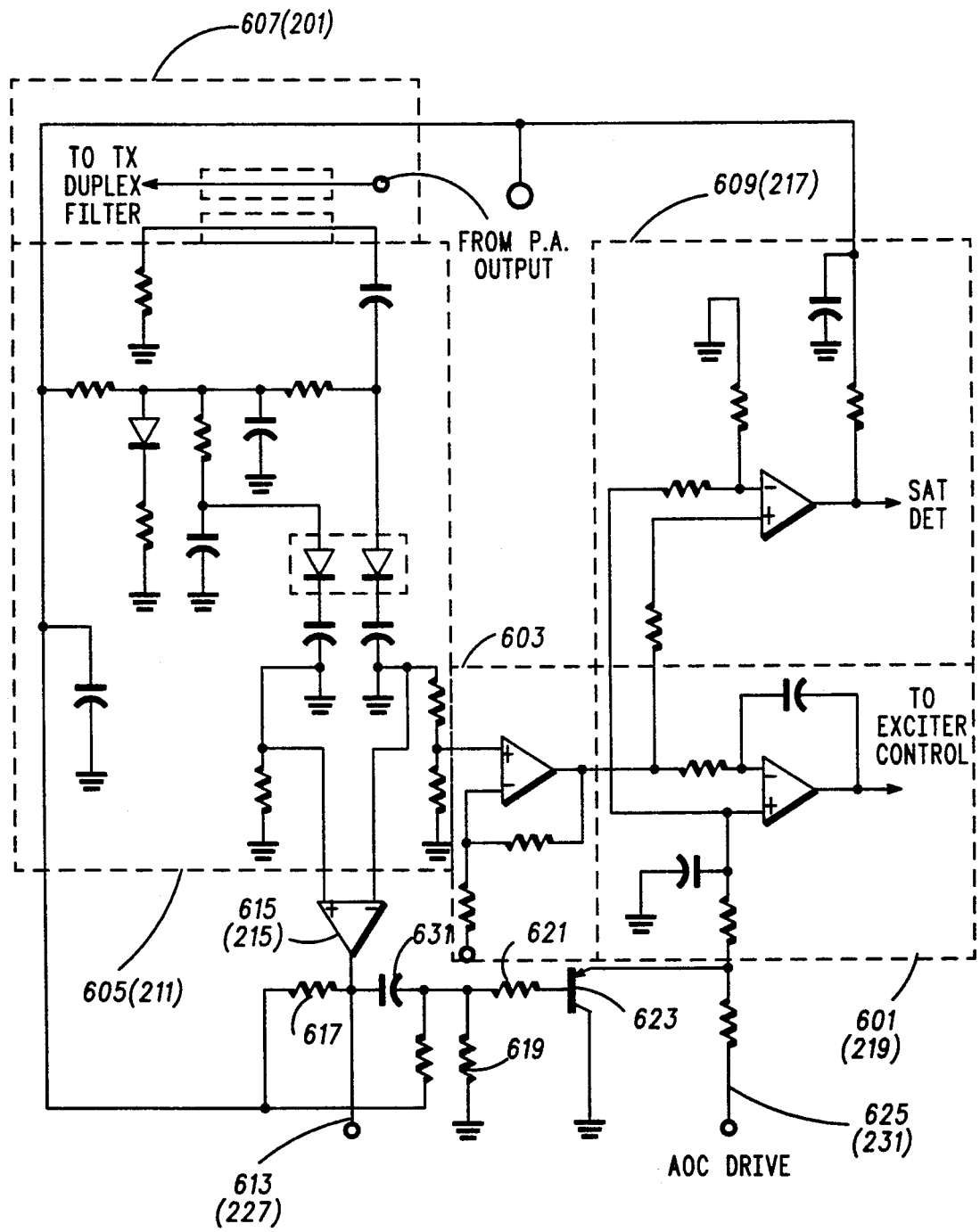
FIG. 6B is a schematic diagram of an alternative embodiment in accordance with the present invention.
Figure 6A:
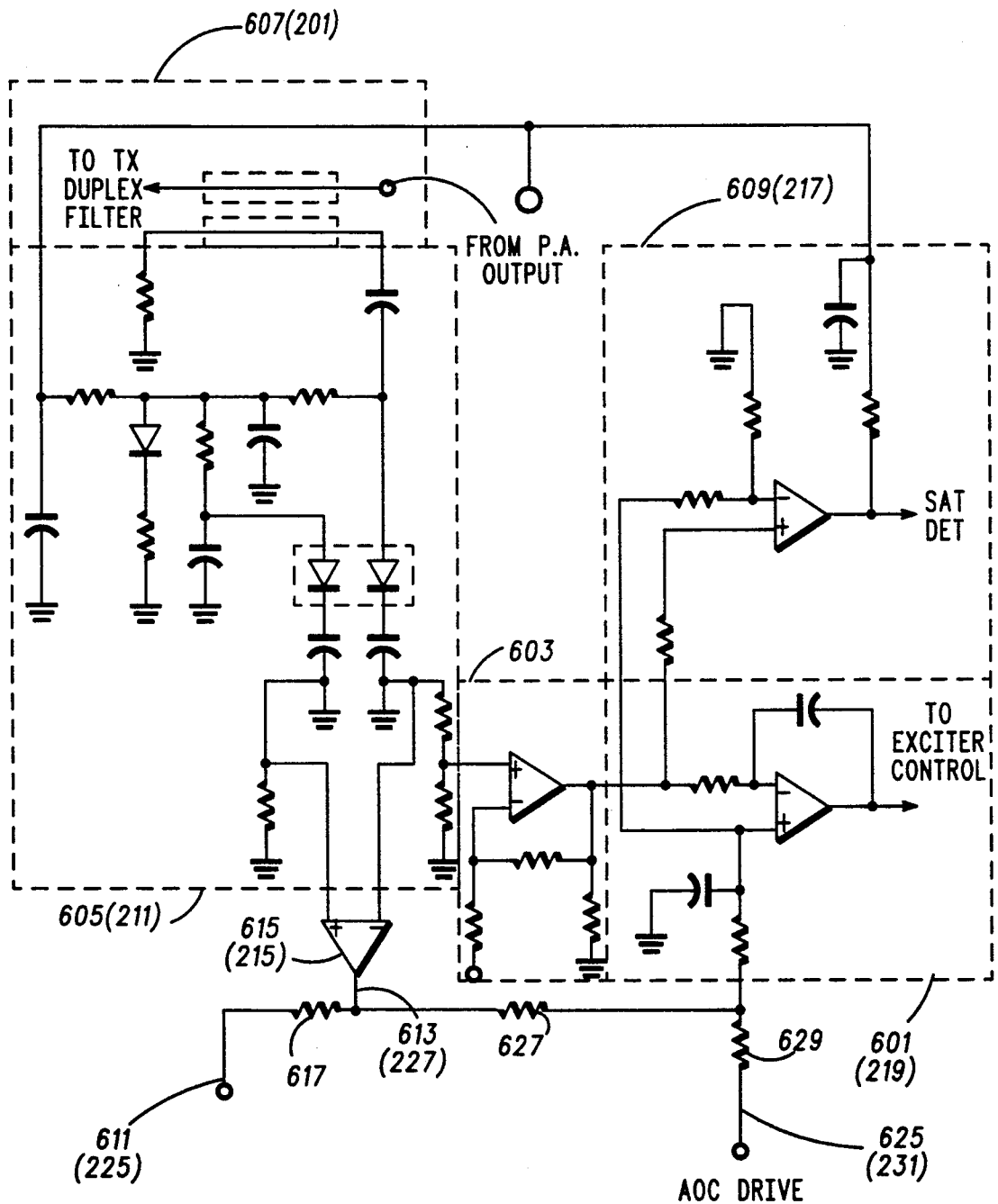
FIG. 6A is a schematic of a power amplifier control circuit in accordance with the present invention.

FIG. 6A illustrates the circuit diagram of a preferred embodiment of the ramp up controller. In this preferred embodiment, the comparator output signal 613 is coupled through resistor 627 to the AOC signal 625. If the output of the comparator 615 is open, thus signifying a non-active PA, and the DSP 223 is providing 5 volts to resistor 617 as a pull-up on the open collector output of the comparator 615, then the ramp up signal is provided on the AOC signal 625 by the voltage division of resistor 629, and resistor 617. When the power amplifier 203 becomes active, the comparator output signal 613 will go low and clamp the junction of resistor 627 and resistor 617 to ground, thus, eliminating the DC pulse. After 10 uS has passed from the beginning of a timeslot, the DSP 223 and D/A converter 221 outputs the desired waveform on the AOC signal 625. Once the DSP 223 has fed the AOC signal 625 with its desired waveform, which in a preferred embodiment is a raised cosine 505, resistor 617 must be pulled low to avoid the up ramp during a non-active transmitter time.

FIG. 6B reveals an alternative circuit diagram of the ramp up controller. The comparator output signal 613 is coupled to the DSP 223 and is indirectly coupled back to the AOC signal 625. The signal 613 which returns to the DSP 223 is used to notify the DSP 223 when the power amplifier 203 has entered its active state. The problem of controlling the output to avoid a surge in the exciter power because of the turn on threshold is illustrated by waveform 303. This problem is caused by the intrinsic delay in the DSP 223 between receiving the comparator output signal 223 and subsequently controlling or limiting the AOC signal 625, therefore, a real time circuit was developed. This circuit is the indirect coupling between the comparator output signal 613 and the AOC signal 625. This circuitry immediately clamps the voltage of the AOC signal 625 to ground upon detection of activity in the power amplifier 203 to avoid the overshoot as illustrated in waveform 401. Upon detection, the comparator output signal 613 grounds the capacitor 631, in the preferred embodiment capacitor 631 has a value of 47 pf. While the capacitor 631 is discharging, it will pull the base of transistor 623 down and thus, saturate transistor 623 until capacitor 631 is discharged. In the preferred embodiment, the resistor 619 and resistor 621 have values of 100 kohms and 220 kohms respectively. Transistor 623 in the preferred embodiment may be an MMBT 3640 available from Motorola, Inc. By saturating the transistor for that amount of time, the voltage of the AOC signal 625 is pulled to ground, maintaining the power amplifier 203 at its turn on threshold until the DSP 223 has time to react. The DSP 223 and D/A converter 221 generates the desired ramp up waveform on the AOC signal 625. In the preferred embodiment the desired waveform is a raised cosine 505 as shown in FIG. 5.

With the implementation of the up ramp control loop a class C amplifier may be smoothly and quickly ramped up to its desired power level in a preferred embodiment without any spectral frequency damage.

We claim:

1. A transmitter including a means for amplifying a first signal and means for controlling the means for amplifying, the means for amplifying having at least two inputs, at least one output, an active state and an inactive state, the first signal having a power level, a first frequency and coupled to a first one of the at least two inputs of the means for amplifying, the means for amplifying responsive to a voltage of a second signal, the means for controlling comprising:

a first means for generating the second signal, said first means for generating having an input and an output, said output of said first means for generating the second signal coupled to a second one of the at least two inputs of the means for amplifying;

means for generating a third signal, responsive to the active state of the means for amplifying, having an input and an output, said input of said means for generating said third signal coupled to a first one of the at least one output of the means for amplifying; and means for determining the voltage level of the second signal, having an input and an output, said input of said means for determining coupled to said output of said means for generating said third signal and said output of said means for determining coupled to said input of said first means for generating the second signal, such that the means for amplifying the first signal is ramped up into the active state without a substantial burst of frequency noise.

2. A transmitter in accordance with claim 1 wherein said means for generating said third signal further comprises:

means for detecting the power level of the first signal, having at least one input and at least one output, a first one of said at least one input coupled to said first input of said means for generating said third signal;

a first reference voltage signal;

means for comparing the power level of the first signal to said first reference voltage signal; and means for generating said third signal responsive to said means for comparing.

3. A transmitter in accordance with claim 1 wherein said means for determining the voltage level of the second signal further comprises a digital signal processor.

4. A transmitter in accordance with claim 1 wherein said means for generating the second signal further comprises a digital to analog converter.

5. A transmitter in accordance with claim 1 wherein said means for controlling further comprises a second means for generating the second signal, coupled between said output of said means for generating said third signal and said second one of the at least two inputs of the means for amplifying.

6. A radiotelephone including a power amplifier and a power amplifier controller, the power amplifier having an active and an inactive state, and amplifying a first input signal, thereby forming an output signal, the power amplifier controller controlling the amplification level of the amplifier, the power amplifier controller comprising:

means for detecting the active and inactive state of the power amplifier, said means for detecting coupled to the output signal of the power amplifier;

means for generating, responsive to said means for detecting, a second signal representing a current state of the power amplifier;

means for determining, responsive to said current state of the power amplifier, a desired voltage level of a third signal;

means for generating said third signal having said desired voltage level coupled to a second input of the power amplifier, such that the amplification level of the power amplifier is controlled; and means for generating, responsive to said means for generating said second signal, a fourth signal, said means for generating said fourth signal having an input and an output, said output coupled to said second input of the power amplifier, and said input coupled to an output of said means for generating said second signal, whereby the amplification of the power amplifier is controlled in absence of said third signal.

7. A radio telephone in accordance with claim 6 wherein said means for determining further comprises a digital signal processor.

8. A radiotelephone in accordance with claim 6 wherein said means for generating said second signal further comprises a digital to analog converter.

9. A radiotelephone in accordance with claim 6 wherein said means for generating said fourth signal further comprises an electrical circuit.

10. A radiotelephone in accordance with claim 9 wherein said electrical circuit further comprises:

means for switching on and off said means for generating said fourth signal; and means, while said means for generating said fourth signal is on, for creating said fourth signal having a predetermined voltage level.

11. A radiotelephone in accordance with claim 10 wherein said means for switching further comprises a transistor.

12. A radiotelephone in accordance with claim 10 wherein said means for switching further comprises a fifth signal having two predetermined voltage levels representing an on and off state.

* * * * *

UNITED STATES PATENT AND TRADEMARK OFFICE
CERTIFICATE OF CORRECTION

PATENT NO. : 5,150,075

DATED : 9/22/92

INVENTOR(S) : Alexander W. Hietala, Gregory R. Black

It is certified that error appears in the above-identified patent and that said Letters Patent is hereby corrected as shown below:

Column 8:

In claim 6, line 20, please delete the word "whereby" and replace therefor with the phrase --such that--.

Signed and Sealed this

Seventh Day of September, 1993

*Attest:*

BRUCE LEHMAN

*Attesting Officer*     Commissioner of Patents and Trademarks